(12) United States Patent
Totsuka

(10) Patent No.: US 7,838,382 B2
(45) Date of Patent: Nov. 23, 2010

(54) SEMICONDUCTOR DEVICE AND METHOD OF MANUFACTURING THE SEMICONDUCTOR DEVICE

(75) Inventor: Masahiro Totsuka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 24 days.

(21) Appl. No.: 12/416,289

(22) Filed: Apr. 1, 2009

(65) Prior Publication Data
US 2010/0127350 A1  May 27, 2010

(30) Foreign Application Priority Data
Nov. 26, 2008  (JP)  ............... 2008-301313

(51) Int. Cl.
*H01L 21/20* (2006.01)
(52) U.S. Cl. .............. 438/393; 438/381; 438/396
(58) Field of Classification Search ........... 257/253, 257/306, 532; 438/240, 612, 393, 396
See application file for complete search history.

(56) References Cited

U.S. PATENT DOCUMENTS

| 5,319,226 A * | 6/1994 | Sohn et al. ............. 257/253 |
| 5,638,319 A * | 6/1997 | Onishi et al. ............ 365/145 |
| 6,436,756 B1 | 8/2002 | Nishimura et al. |
| 6,777,776 B2 * | 8/2004 | Hieda ................... 257/532 |
| 2003/0096473 A1 * | 5/2003 | Shih et al. ............... 438/240 |
| 2005/0218520 A1 * | 10/2005 | Kikuta et al. ............ 257/758 |

FOREIGN PATENT DOCUMENTS

| JP | 11-145387 A | 5/1999 |
| JP | 2004-152796 A | 5/2004 |

* cited by examiner

*Primary Examiner*—Thanh V Pham
*Assistant Examiner*—Errol Fernandes
(74) *Attorney, Agent, or Firm*—Leydig, Voit & Mayer, Ltd.

(57) ABSTRACT

A method of manufacturing a semiconductor device includes forming a lower electrode on a semiconductor substrate, applying a photoresist on the lower electrode, forming an opening in the photoresist spaced from the periphery of the lower electrode, forming a high-dielectric constant film of a high-k material having a dielectric constant of 10 or more, performing liftoff so that the high-dielectric-constant film remains on the lower electrode, and forming an upper electrode on the high-dielectric-constant film remaining after the liftoff.

11 Claims, 10 Drawing Sheets

SEMICONDUCTOR DEVICE AND METHOD OF MANUFACTURING THE SEMICONDUCTOR DEVICE

BACKGROUND OF THE INVENTION

1. Field of the Invention

The present invention relates to a method capable of easily manufacturing a semiconductor device in which a high-dielectric-constant film of a metal-insulator-metal (MIM) capacitor constituted of a high-k material having a dielectric constant of 10 or more is not formed in any of places where transistors or pieces of wiring are provided. The present invention also relates to a semiconductor device and a semiconductor device manufacturing method capable of preventing separation of a high-dielectric-constant film and an upper electrode of an MIM capacitor.

2. Background Art

Conventionally, in a case where a large-capacitance MIM capacitor is formed on a semiconductor substrate or in a case where an MIM capacitor is formed in a smaller area, a high-dielectric-constant film constituted of a high-k material having a dielectric constant of 10 or more, e.g., $Ta_2O_5$ is used as a dielectric film for the MIM capacitor (see, e.g., Patent Document 1 and 2).

[Patent Document 1] Japanese Laid-Open Patent Publication No. Hei 11-145387
[Patent Document 2] Japanese Laid-Open Patent Publication No. 2004-152796

A high-k material having a dielectric constant of 10 or more has high chemical stability in particular, and it is difficult to work by etching a high-dielectric-constant film constituted of such a high-k material. In the case of forming a dielectric film for an MIM capacitor from such a high-dielectric-constant film, therefore, it is difficult to remove the high-dielectric-constant film formed in a place where a transistor or a piece of wiring is formed. As a result, the parasitic capacitance of the transistor is increased or a wiring delay occurs.

Sputtering is applied to forming of a high-dielectric-constant film. The adhesion between a high-dielectric-constant film and a lower electrode of an MIM capacitor is weaker in the case of forming the high-dielectric-constant film by using sputtering than in the case of forming the high-dielectric-constant film by using chemical vapor deposition (CVD) with high reactivity at a growth surface. Thus, there has been a problem of such a high-dielectric-constant film being easily separable from a lower electrode. Further, an upper electrode of an MIM capacitor is separable more easily in the case of being formed on such a high-dielectric-constant film than in the case of being formed on a CVD insulating film ordinarily used as a dielectric film for MIM capacitors.

SUMMARY OF THE INVENTION

To solve the above-described problems, a first object of the present invention is to provide a method capable of easily manufacturing a semiconductor device in which a high-dielectric-constant film of an MIM capacitor constituted of a high-k material having a dielectric constant of 10 or more is not formed in any of places where transistors or pieces of wiring are provided. A second object of the present invention also is to provide a semiconductor device and a semiconductor device manufacturing method capable of preventing separation of a high-dielectric-constant film and an upper electrode of an MIM capacitor.

According to one aspect of the present invention, a method of manufacturing a semiconductor device includes the steps described below. One of the steps is forming a lower electrode on a semiconductor substrate. Another of the steps is applying a photoresist on the lower electrode. Another of the steps is forming an opening in the photoresist on the center side from a peripheral portion of the lower electrode. Another of the steps is forming a high-dielectric constant film constituted of a high-k material having a dielectric constant of 10 or more in the opening and on the photoresist. Another of the steps is performing liftoff for removing the photoresist and the high-dielectric-constant film on the photoresist so that the high-dielectric-constant film remains on the center side from the peripheral portion of the lower electrode. Another of the steps is forming an upper electrode on the high-dielectric-constant film remaining as a result of the liftoff.

According to another aspect of the present invention, a semiconductor device includes a semiconductor substrate, a lower electrode provided on the semiconductor substrate, a high-dielectric constant film provided on the lower electrode and constituted of a high-k material having a dielectric constant of 10 or more, an upper electrode provided on the high-dielectric constant film, and a CVD insulating film provided in at least one of a position between the lower electrode and the high-dielectric-constant film and a position between the high-dielectric-constant film and the upper electrode, and between the lower electrode and the upper electrode in a place where the high-dielectric-constant film is not provided. The adhesion of the CVD insulating film to the lower electrode and the upper electrode is stronger than that of the high-dielectric-constant film. The film thickness of the CVD insulating film is 30 to 50 nm.

According to another aspect of the present invention, a semiconductor device includes a semiconductor substrate, a lower electrode provided on the semiconductor substrate, a high-dielectric constant film provided on the lower electrode and constituted of a high-k material having a dielectric constant of 10 or more, an upper electrode provided on the high-dielectric constant film, and a CVD insulating film provided in at least one of a position between the lower electrode and the high-dielectric-constant film and a position between the high-dielectric-constant film and the upper electrode. The adhesion of the CVD insulating film to the lower electrode and the upper electrode is stronger than that of the high-dielectric-constant film. The ratio of the film thickness of the CVD insulating film and the sum of the film thicknesses of the high-dielectric-constant film and the CVD insulating film is 1:9 to 1:11.

According to another aspect of the present invention, a method of manufacturing a semiconductor device includes the steps described below. One of the steps is forming a lower electrode on a semiconductor substrate. Another of the steps is forming, by sputtering, on the lower electrode, a high-dielectric constant film constituted of a high-k material having a dielectric constant of 10 or more. Another of the steps is forming an upper electrode on the high-dielectric constant film. Another of the steps is forming, by CVD, a CVD insulating film in at least one of a position between the lower electrode and the high-dielectric-constant film and a position between the high-dielectric-constant film and the upper electrode, and between the lower electrode and the upper electrode in a place where the high-dielectric-constant film is not provided. The film thickness of the CVD insulating film is set to 30 to 50 nm.

According to another aspect of the present invention, a method of manufacturing a semiconductor device includes the steps described below. One of the steps is forming a lower electrode on a semiconductor substrate. Another of the steps is forming, by sputtering, on the lower electrode, a high-dielectric constant film constituted of a high-k material having a dielectric constant of 10 or more. Another of the steps is forming an upper electrode on the high-dielectric constant film. Another of the steps is forming, by CVD, a CVD insulating film in at least one of a position between the lower electrode and the high-dielectric-constant film and a position between the high-dielectric-constant film and the upper electrode. The ratio of the film thickness of the CVD insulating film and the sum of the film thicknesses of the high-dielectric-constant film and the CVD insulating film is set to 1:9 to 1:11.

Other objects and further features of the present invention will be apparent from the following detailed description when read in conjunction with the accompanying drawings.

DETAILED DESCRIPTION OF THE PREFERRED EMBODIMENTS

Figure 1:
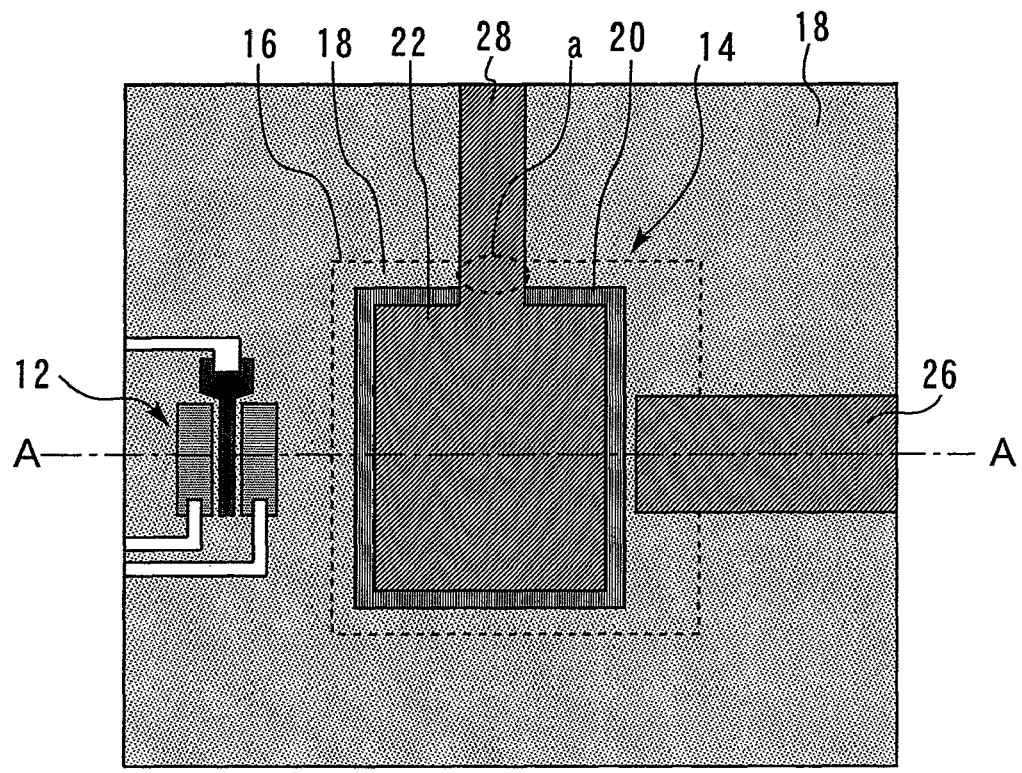
FIG. 1 is a top view of a semiconductor device according to the first embodiment.

Now, embodiments of the present invention will be described with reference to the drawings. Like reference numerals denote like components throughout the drawings, and redundant descriptions will be omitted.

First Embodiment

Semiconductor Device in the First Embodiment

Figure 2:
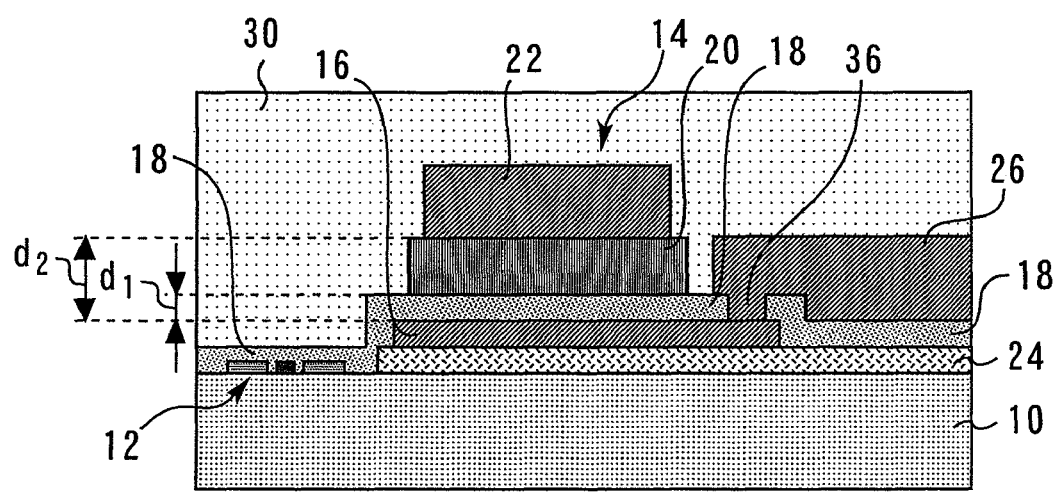
FIG. 2 is a sectional view taken along line A-A' in FIG. 1.

A semiconductor device according to the first embodiment of the present invention will be described below. FIG. 1 is a top view of a semiconductor device according to the first embodiment. FIG. 2 is a sectional view taken along line A-A' in FIG. 1.

As shown in FIGS. 1 and 2, a GaAs high-electron-mobility (HEMT) transistor (hereinafter referred to briefly as "transistor") 12 and a metal-insulator-metal (MIM) capacitor 14 are provided on a semiconductor substrate 10. The transistor 12 and the MIM capacitor 14 constitute a monolithic microwave IC (MMIC).

The MIM capacitor 14 has a lower electrode 16, a CVD insulating film 18, a high-dielectric-constant film 20 and an upper electrode 22. The lower electrode 16 is provided on the semiconductor substrate 10, with an insulating film 24 interposed therebetween. The CVD insulating film 18 is provided on the lower electrode 16. The high-dielectric-constant film 20 is provided on the CVD insulating film 18 on the center side from an outer peripheral portion of the lower electrode 16. The upper electrode 22 is provided on the high-dielectric-constant film 20. A piece of wiring 26 connected to the lower electrode 16 via a contact hole 36 is provided. A piece of wiring 28 connected to the upper electrode 22 is provided. A protective film 30 is provided so as to cover the transistor 12 and the MIM capacitor 14.

The CVD insulating film 18 is constituted of SiN. The CVD insulating film 18 is also provided between the lower electrode 16 and the upper electrode 22 in a region indicated by reference character "a" in FIG. 1, where The high-dielectric-constant film 20 is not provided. The high-dielectric-constant film 20 is constituted of a high-k material having a dielectric constant of 10 or more (such as $ZrO_2$, $Ta_2O_5$ or $HfO_2$)

In FIG. 2, d1 denotes the film thickness of the CVD insulating film 18 and d2 denotes the sum of the film thicknesses of the high-dielectric-constant film 20 and the CVD insulating film 18. In the present embodiment, the film thickness d1 of the CVD insulating film 18 is set to 30 nm; the film thickness of the high-dielectric-constant film 20 is set to 270 nm; and the total film thickness d2, i.e., the sum of the film thicknesses of the high-dielectric-constant film 20 and the CVD insulating film 18, is set to 300 nm.

Method of Manufacturing the Semiconductor Device in the First Embodiment

A method of manufacturing the semiconductor device according to the first embodiment will be described. FIGS. 3 to 8 are process sectional views showing a method of manufacturing the semiconductor device according to the first embodiment of the present invention.

Figure 3:
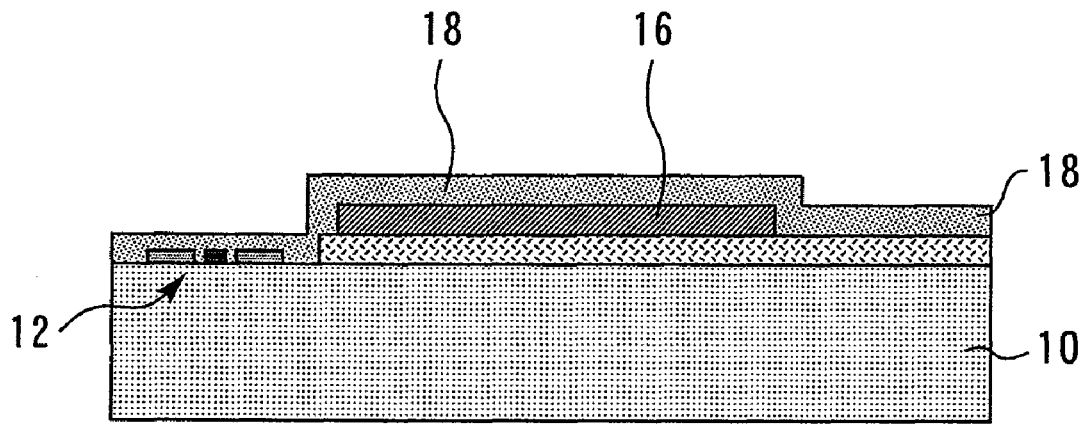
FIGS. 3 to 8 are process sectional views showing a method of manufacturing the semiconductor device according to the first embodiment of the present invention.

First, as shown in FIG. 3, the transistor 12 and the lower electrode 16 are formed on the semiconductor substrate 10. The CVD insulating film 18 is formed by CVD so as to cover the transistor 12 and the lower electrode 16. As the CVD insulating film 18, a film constituted of SiN ordinarily used as a dielectric film for a MIM capacitor is used. The thickness of the CVD insulating film 18 is set to 30 nm.

Figure 4:
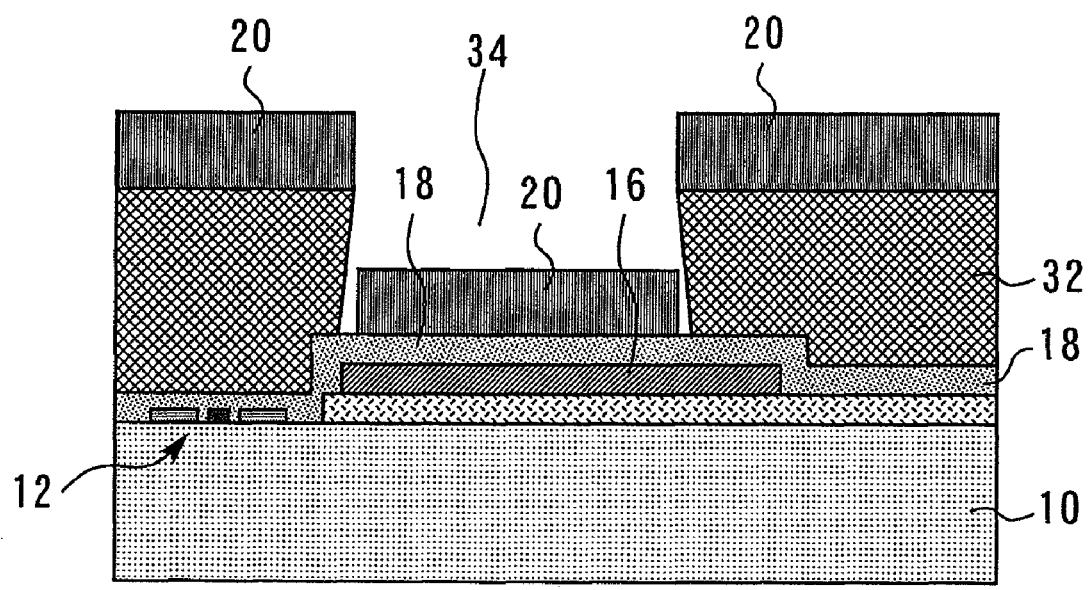

Subsequently, as shown in FIG. 4, a photoresist 32 is applied on the CVD insulating film 18 and an opening 34 is formed in the photoresist 32 on the center side from an outer peripheral portion of the lower electrode 16. The High-dielectric-constant film 20 constituted of a high-k material having a dielectric constant of 10 or more (such as $ZrO_2$, $Ta_2O_5$ or $HfO_2$) is formed by sputtering inside the opening 34 and on the photoresist 32. The film thickness of the high-dielectric-constant film 20 is set to 270 nm.

Figure 5:
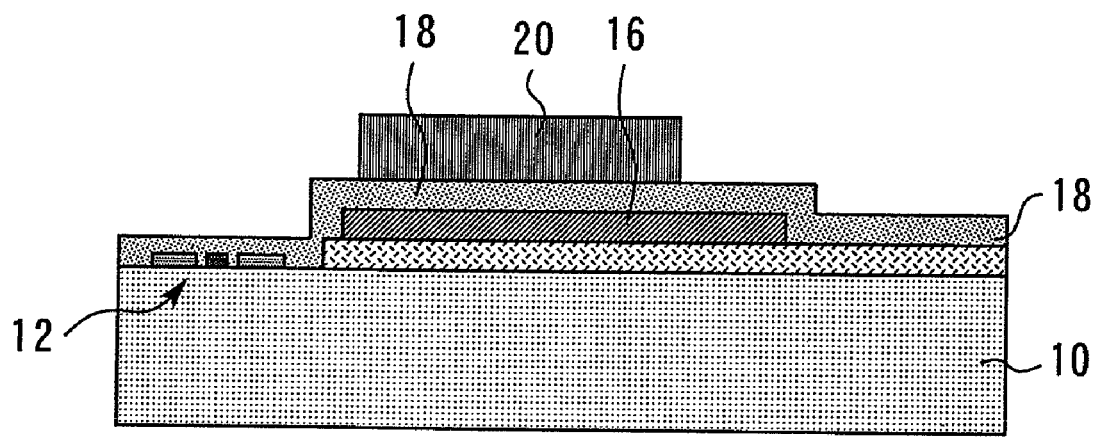
Figure 6:
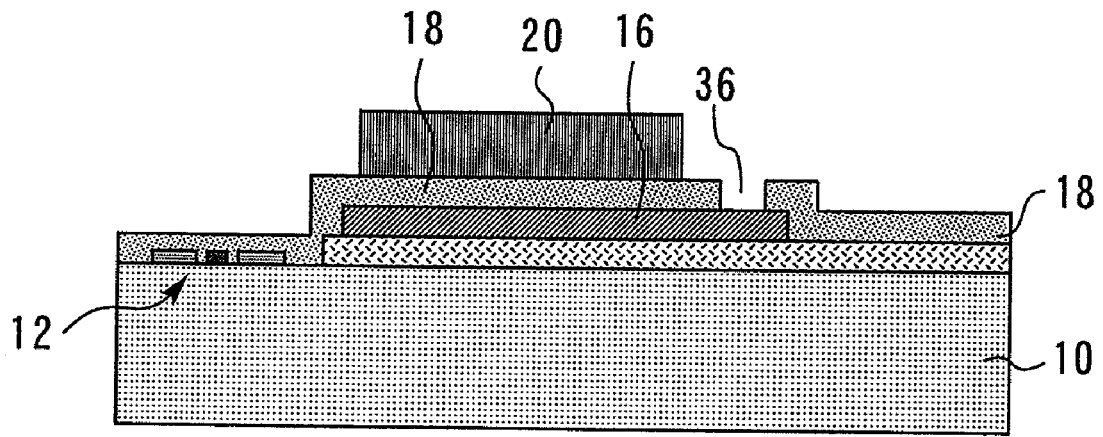

Subsequently, as shown in FIG. 5, liftoff for removing the photoresist 32 and the high-dielectric-constant film 20 on the photoresist 32 is performed so that the high-dielectric-constant film 20 remains on the center side from the outer peripheral portion of the lower electrode 16. Thereafter, as shown in FIG. 6, the contact hole 36 is formed in the CVD insulating film 18.

Figure 7:
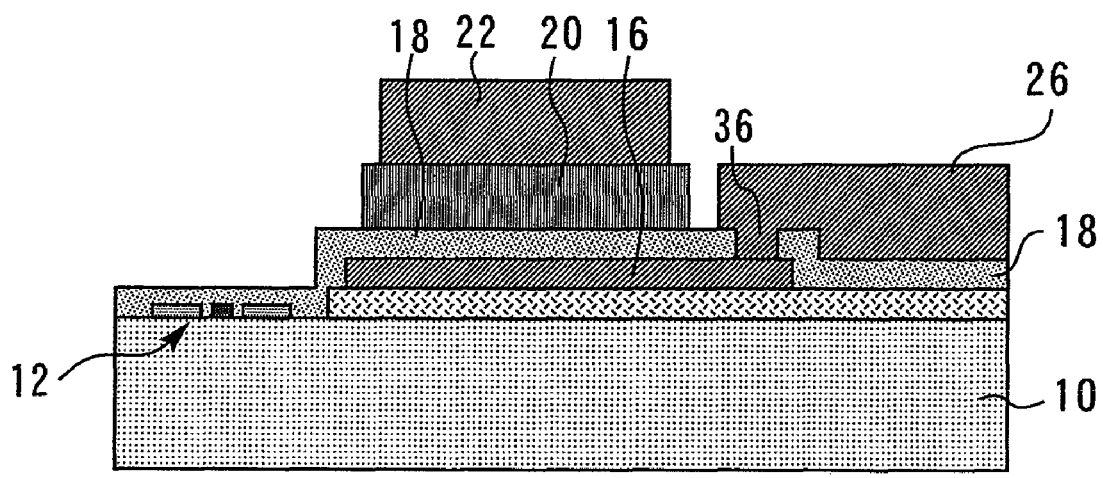

Subsequently, as shown in FIG. 7, the upper electrode 22 is formed on the high-dielectric-constant film 20 remaining after the liftoff. At this time, the piece of wiring 26 connected to the lower electrode 16 and the piece of wiring connected to the upper electrode 22 (not shown) are formed simultaneously with the upper electrode 22.

Figure 8:
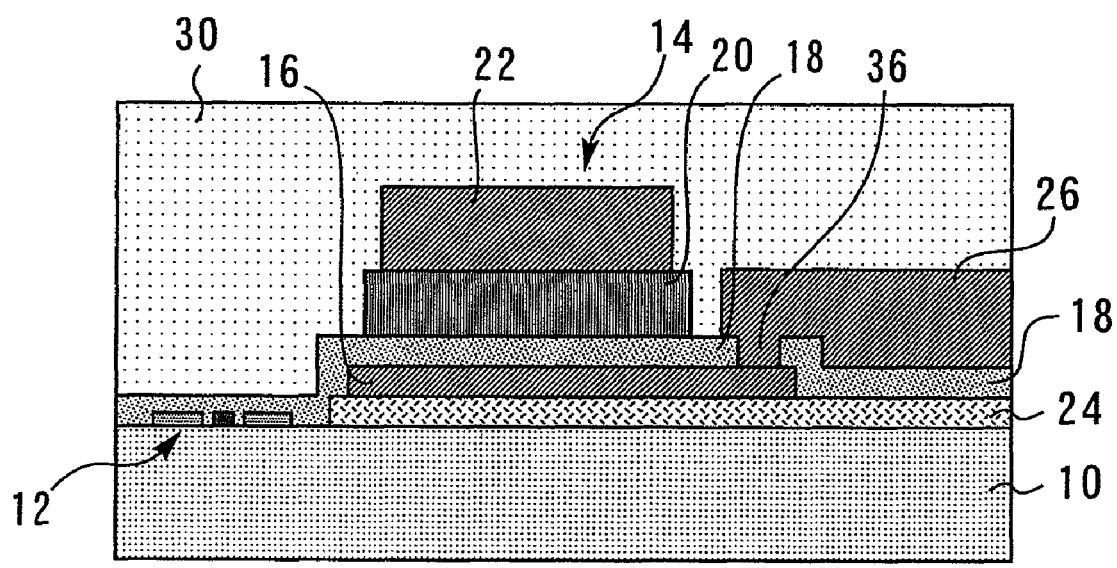

Subsequently, as shown in FIG. 8, the protective film 30 is formed so as to cover the transistor 12 and the MIM capacitor 14. The semiconductor device according to the first embodiment is manufactured by the above-described process.

Advantages of the First Embodiment

The advantages of the first embodiment will be described.

Figure 9:
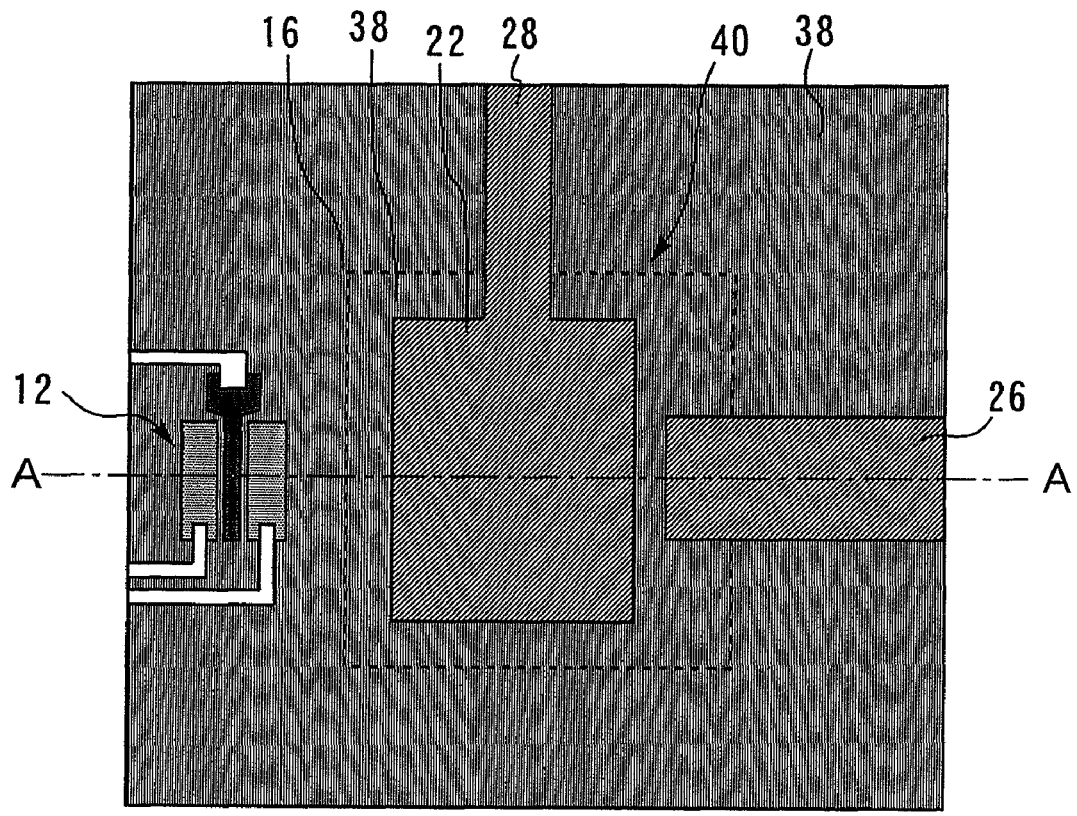
FIG. 9 is a top view showing a semiconductor device according to the first comparative example.
Figure 10:
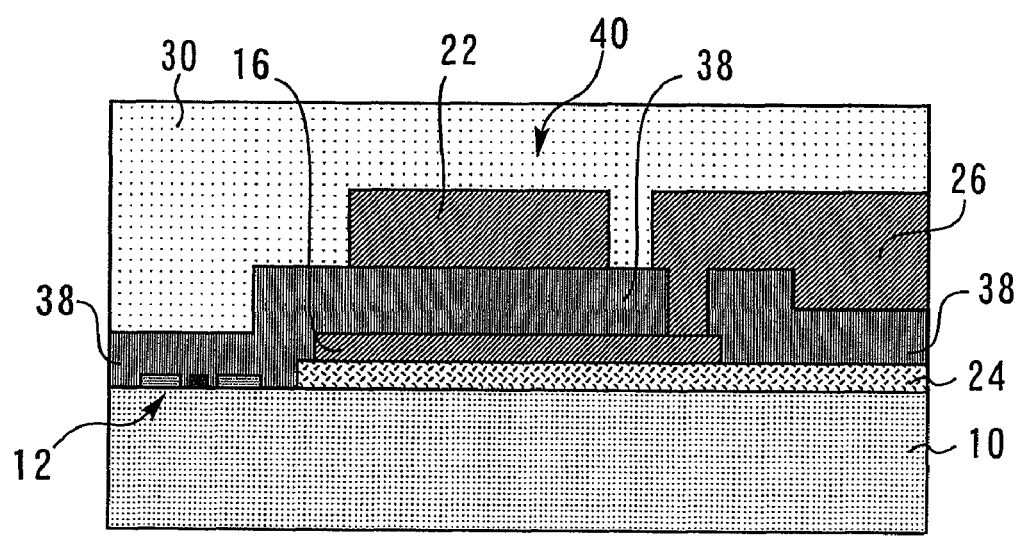
FIG. 10 is a sectional view taken along line A-A' in FIG. 9.

The advantage obtained by applying liftoff and CVD will first be described by way of comparison with a first comparative example. FIG. 9 is a top view showing a semiconductor device according to the first comparative example. FIG. 10 is a sectional view taken along line A-A' in FIG. 9.

As shown in FIGS. 9 and 10, a dielectric film for a MIM capacitor 40 is constituted only of a high-dielectric-constant film 38 unlike that in the first embodiment. The high-dielectric-constant film 38 is constituted of a high-k material having a dielectric constant of 10 or more (such as $ZrO_2$, $Ta_2O_5$ or $HfO_2$). A film constituted of this high-k material has high chemical stability and is difficult to etch. Further, the high-dielectric-constant film 38 has a film thickness of 200 to 300 nm for enabling the MIM capacitor to have a high withstand voltage of 100 to 150 V. Due to this thickness, it is, therefore, difficult to work the high-dielectric-constant film 38 by etching such as reactive ion etching (RIE). Consequently, it is difficult to form by etching the high-dielectric-constant film 38 so that the film remains only on the center side from an outer peripheral portion of the lower electrode 16.

In the first comparative example, therefore, the transistor 12 and the lower electrode 16 are covered with the high-dielectric-constant film 38, and the piece of wiring 26 is formed on the high-dielectric-constant film 38. Also, the high-k material constituting the high-dielectric-constant film 38 has a dielectric constant higher than that of a CVD insulating film (e.g., SiN) ordinarily used as a dielectric film for MIM capacitors. Accordingly, the parasitic capacitance of the transistor 12 according to the first comparative example is increased relative to that when the CVD insulating film (e.g., SiN) is used as a dielectric film. Also, in this case, a wiring delay is caused by the piece of wiring 26 according to the first comparative example. It is also difficult to form the contact hole in the high-dielectric-constant film 38 by etching.

To form the high-dielectric-constant film 38 constituted of a high-k material having a dielectric constant of 10 or more and having a large film thickness of 200 to 300 nm, sputtering is ordinarily used. Therefore, the adhesion of the high-dielectric-constant film 38 to the lower electrode 16 is weaker in the case of film forming using sputtering than in the case of film forming using CVD with high reactivity at a growth surface. As a result, the high-dielectric-constant film 38 separates from the lower electrode 16.

On the other hand, in the first embodiment, the high-dielectric-constant film 20 is formed by using liftoff so that the high-dielectric-constant film 20 remains on the center side from the peripheral portion of the lower electrode 16. A semiconductor device in which the high-dielectric-constant film 20 is not formed in the place where the transistor 12 and the piece of wiring 26 are provided can be easily manufactured. As a result, covering the transistor 12 with the high-dielectric-constant film 20 can be avoided to achieve prevention of an increase in parasitic capacitance of the transistor 12. Also, providing the high-dielectric-constant film 20 in the vicinity of the piece of wiring 26 can be avoided to achieve prevention of occurrence of a wiring delay.

Also, unlike the high-dielectric-constant film 38 formed by sputtering according to the first comparative example, the CVD insulating film 18 according to the first embodiment is formed by using CVD with high reactivity at a growth surface. Therefore, the CVD insulating film 18 according to the first embodiment has higher adhesion to the lower electrode 16 in comparison with the high-dielectric-constant film 38 according to the first comparative example. In the first embodiment, therefore, separation of the high-dielectric-constant film 20 can be prevented.

The advantage obtained by setting the film thickness d1 of the CVD insulating film 18 to 30 nm will next be described. The CVD insulating film 18 is constituted of SiN having a dielectric constant of 7 and has a dielectric constant lower than that of the high-dielectric-constant film 20 constituted of a high-k material having a dielectric constant of 10 or more. Therefore, the film thickness d1 of the CVD insulating film 18 may be reduced to increase the capacitance of the MIM capacitor. Increasing the capacitance of the MIM capacitor requires setting the film thickness d1 to 50 nm or less. In the region indicated by reference character "a" in FIG. 1, where no high-dielectric-constant film 20 is provided, the CVD insulating film 18 is provided between the lower electrode 16 and the piece of wiring 28 connected to the upper electrode 22. The necessary insulation withstand voltage of the CVD insulating film 18 between the lower electrode 16 and the piece of wiring 28 connected to the upper electrode 22 is 30 to 50 V. The insulation withstand voltage of the CVD insulating film 18 constituted of SiN is 10 MV/cm. Therefore, obtaining the desired insulation withstand voltage of the MIM capacitor requires setting the film thickness d1 to 30 nm or more.

Consequently, the film thickness d1 of the CVD insulating film 18 may be set within the range from 30 to 50 nm to increase the capacitance of the MIM capacitor 14 as well as to obtain the desired insulation withstand voltage of the CVD insulating film 18. In the first embodiment, since the film thickness d1 is set to 30 nm, the film thickness d1 falls within this range, and thus achieving the advantage.

The CVD insulating film 18 constituted of SiO or SiON also has an insulation withstand voltage of 10 MV/cm. Therefore, the CVD insulating film 18 may be constituted of SiO or SiON instead of being constituted of SiN. Also in such a case, increasing the capacitance of the MIM capacitor 14 and obtaining the desired insulation withstand voltage of the CVD insulating film 18 can be achieved by setting the film thickness d1 within the range from 30 to 50 nm. The same can also be said with respects to another embodiment described below.

Figure 11:
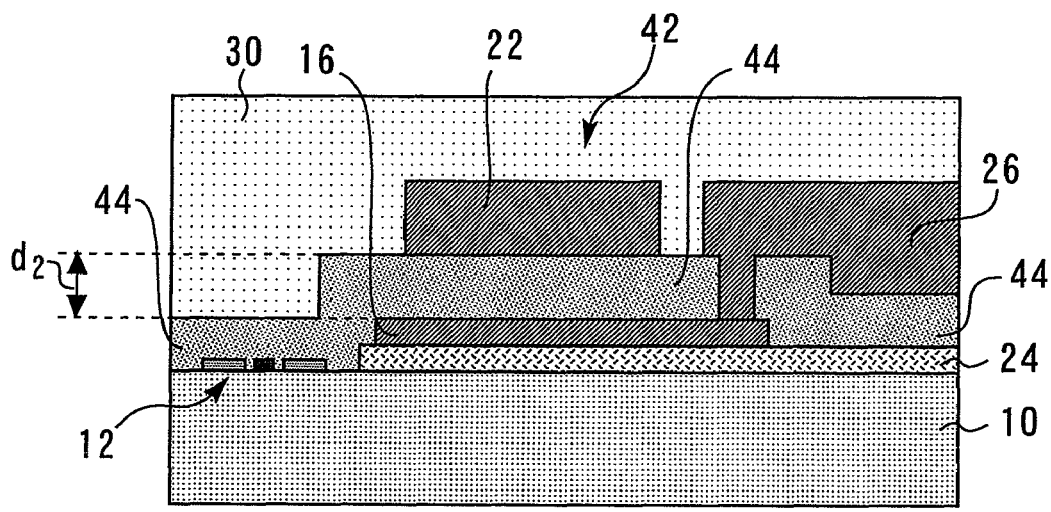
FIG. 11 is a sectional view of a semiconductor device having an MIM capacitor according to the second comparative example.
Figure 12:
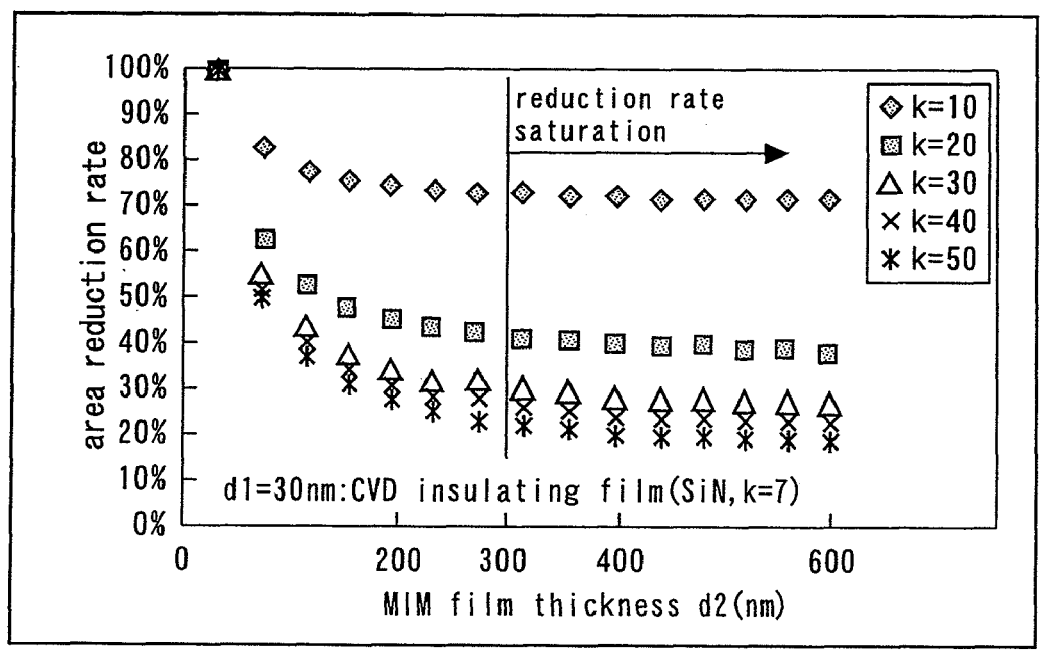
FIG. 12 is a diagram showing the area reduction rate of the MIM capacitor including the CVD insulating film constituted of SiN according to the first embodiment.

The advantage obtained by setting the total film thickness d2 of the high-dielectric-constant film 20 and the CVD insulating film 18 to 300 nm will be described by way of comparison with a second comparative example. FIG. 11 is a sectional view of a semiconductor device having an MIM capacitor according to the second comparative example. In an MIM capacitor 42 according to the second comparative example, the dielectric film is constituted only of a CVD insulating film 44. In other respects, the construction according to the second comparative example is the same as that of the first embodiment. The film thickness of the CVD insulating film 44 according to the second comparative example is the same as the total film thickness d2 of the high-dielectric-constant film 20 and the CVD insulating film 18 shown in FIG. 2. FIG. 12 is a diagram showing the area reduction rate of the MIM capacitor including the CVD insulating film constituted of SiN according to the first embodiment. The area reduction rate indicates the amount of reduction by which the area of the MIM capacitor 14 according to the first embodiment can be reduced relative to that of the MIM capacitor 42 according to the second comparative example in obtaining the same capacitance value. The area reduction rate can be obtained by equalizing the areas of the MIM capacitor 14 including the high-dielectric-constant film 20 according to the first embodiment and the MIM capacitor 42 including no high-dielectric-constant film 20 according to the second comparative example, measuring the capacitance values of the two capacitors and computing the ratio of the capacitance values. The area reduction rate was obtained by setting the film thickness d1 shown in FIG. 2 to a constant value of 30 nm and setting the film thickness d2 shown in FIGS. 2 and 11 to various values in the range from 30 to 600 nm. The area reduction rate was obtained with respect to the high-dielectric-constant films 20 having dielectric constants of 10 to 50 (represented by k in FIG. 12).

As shown in FIG. 12, the area reduction rate is reduced at each dielectric constant if the film thickness d2 is increased. This indicates that if the film thickness d2 is increased, the area of the MIM capacitor 14 to which the high-dielectric-constant film 20 is applied can be reduced in comparison with the case where the high-dielectric-constant film 20 is not applied. However, at each dielectric constant value, the area reduction rate is not noticeably changed (is saturated) from its value corresponding to the ratio 1:10 of the film thickness d1 and the film thickness d2 when the film thickness d2 is increased from the value (300 nm) at which the ratio is 1:10.

Ordinarily, increasing the withstand voltage of the MIM capacitor 14 so that the necessary insulation withstand voltage is obtained requires increasing the film thickness d2 to about 300 nm. Also, there is a demand for increasing the capacitance of the capacitor 14 as well as increasing the withstand voltage. As described above, the area reduction rate becomes lower before the film thickness d2 becomes equal to 300 nm, but it saturates when the film thickness d2 exceeds this value. This indicates that while the capacitance increasing effect based on application of the high-dielectric-constant film 20 is noticeable before the film thickness d2 exceeds 300 nm, the influence of the reduction in capacitance due to the increase in the film thickness d2 becomes stronger when the film thickness d2 exceeds 300 nm.

Consequently, increasing both the withstand voltage and the capacitance of the MIM capacitor 14 can be achieved most advantageously by setting the ratio of the film thickness d1 and the film thickness d2 to 1:10 (by setting the film thickness d1 to 30 nm and setting the film thickness d2 to 300 nm). Since the ratio at which the area reduction rate saturates is not definitely fixed, the effect of achieving both increasing the withstand voltage and increasing the capacitance can be obtained if the ratio of the film thickness d1 and the film thickness d2 is in the range from 1:9 to 1:11.

In a case where the CVD insulating film 18 and the high-dielectric-constant film 20 are formed by a film forming apparatus, an error of ±10% can occur in the film thickness. Even in such a case, film forming may be performed by setting as a target value the ratio 1:10 of the film thickness d1 and the film thickness d2 for increasing the withstand voltage and the capacitance. Even if an error occurs, the probability that the ratio can fall within the range from 1:9 to 1:11 is high. The same can also be said with respects to another embodiment described below.

Second Embodiment

Semiconductor Device in the Second Embodiment

Figure 13:
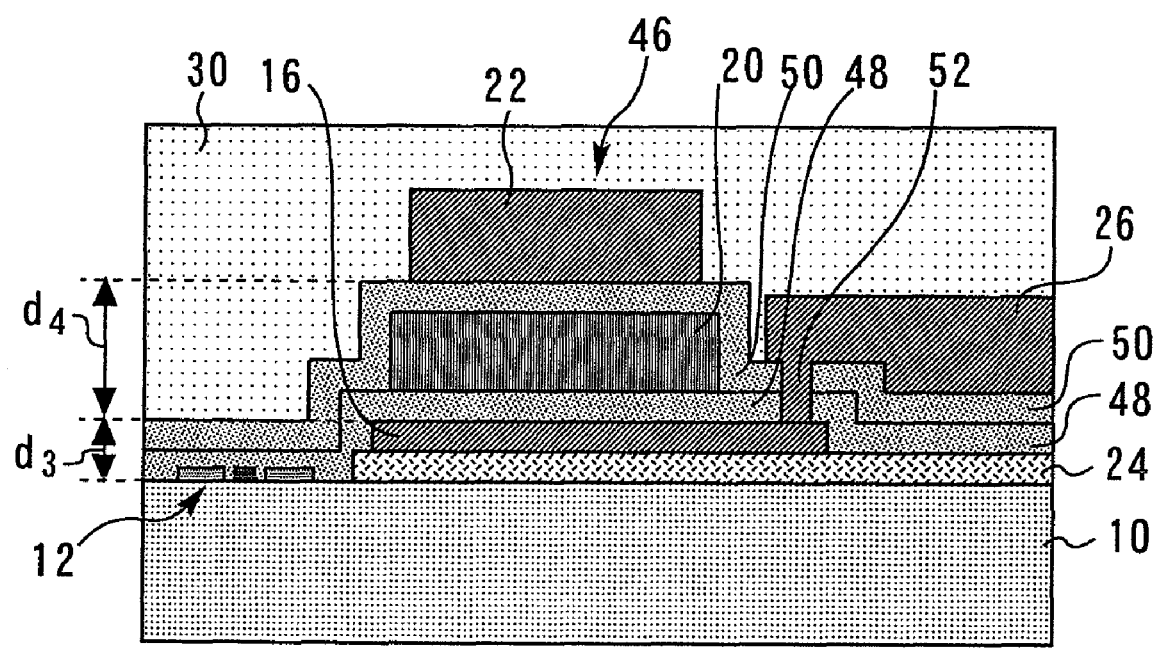
FIG. 13 is a sectional view of a semiconductor device according to the second embodiment.

A semiconductor device according to the second embodiment of the present invention will be described below. FIG. 13 is a sectional view of a semiconductor device according to the second embodiment.

As shown in FIG. 13, an MIM capacitor 46 has a lower electrode 16, a first CVD insulating film 48, a high-dielectric-constant film 20, a second CVD insulating film 50 and an upper electrode 22. The lower electrode 16 is provided on a semiconductor substrate 10, with an insulating film 24 interposed therebetween. The first CVD insulating film 48 is provided on the lower electrode 16. The high-dielectric-constant film 20 is provided on the first CVD insulating film 48 on the center side from an outer peripheral portion of the lower electrode 16. The second CVD insulating film 50 is provided on the high-dielectric-constant film 20. The upper electrode 22 is provided on the second CVD insulating film 50 by being positioned above the high-dielectric-constant film 20. The first CVD insulating film 48 and the second CVD insulating film 50 are constituted of SiN. The high-dielectric-constant film 20 is constituted of a high-k material having a dielectric constant of 10 or more (such as $ZrO_2$, $Ta_2O_5$ or $HfO_2$).

In FIG. 13, d3 denotes the sum of the film thicknesses of the first CVD insulating film 48 and the second CVD insulating film 50, and d4 denotes the sum of the film thicknesses of the first CVD insulating film 48, the high-dielectric-constant film 20 and the second CVD insulating film 50. In the present embodiment, the film thickness d3 is set to 30 nm and the film thickness d4 is set to 300 nm. In other respects, the construction of the semiconductor device according to the second embodiment is the same as that of the semiconductor device according to the first embodiment.

Method of Manufacturing the Semiconductor Device in the Second Embodiment

A method of manufacturing the semiconductor device according to the second embodiment will be described below. FIGS. 14 to 19 are process sectional views showing a method of manufacturing the semiconductor device according to the second embodiment of the present invention.

Figure 14:
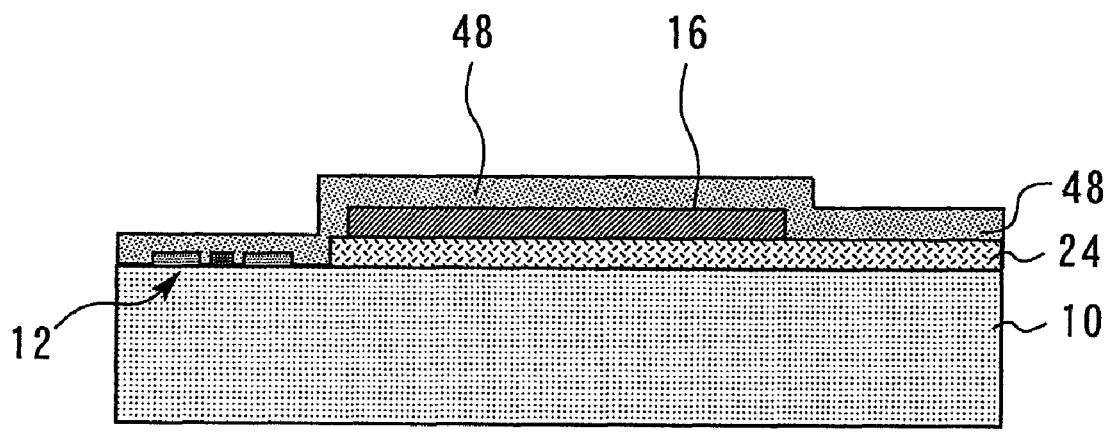
FIGS. 14 to 19 are process sectional views showing a method of manufacturing the semiconductor device according to the second embodiment of the present invention.
Figure 15:
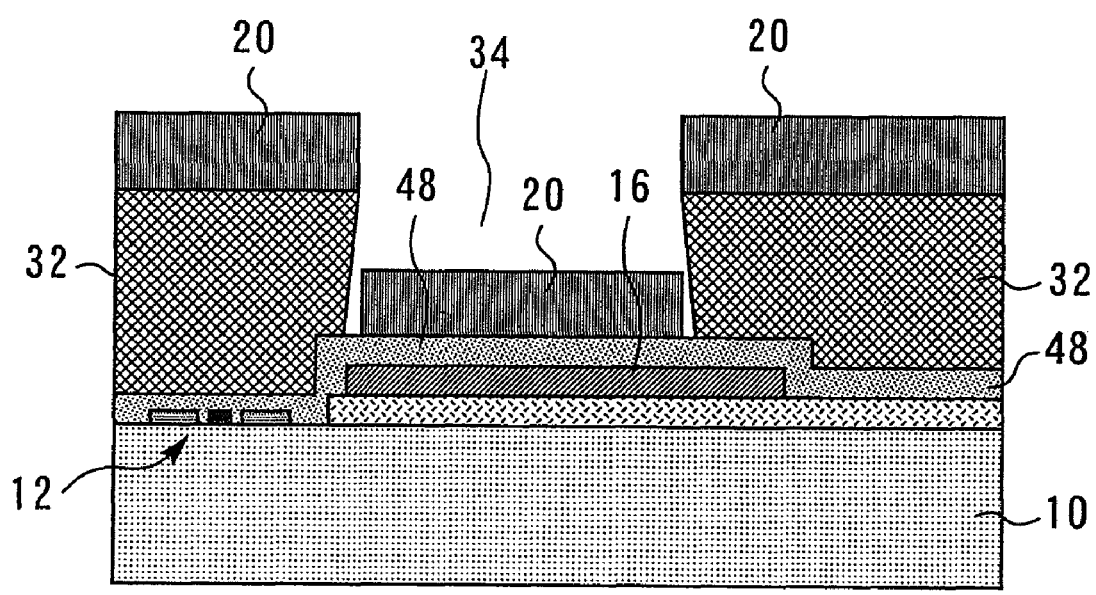
Figure 16:
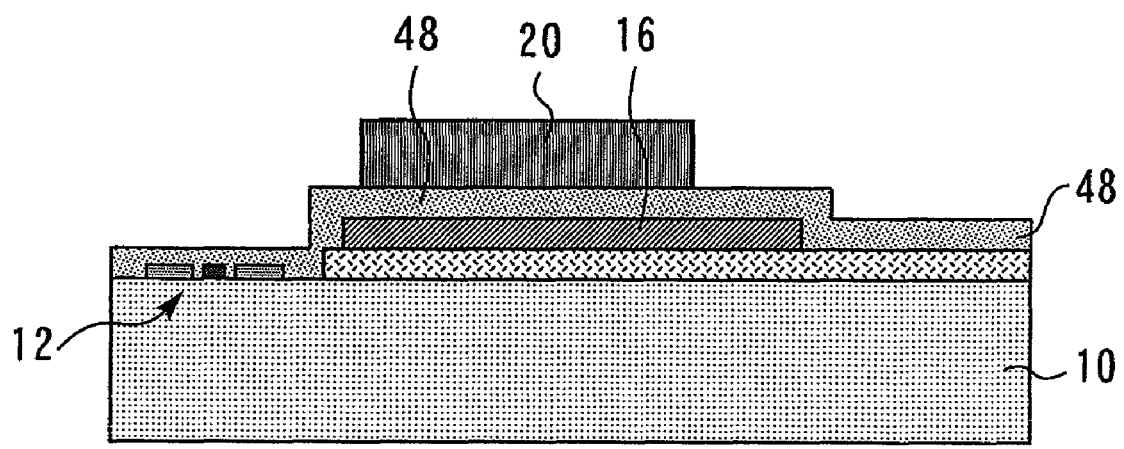

First, as shown in FIGS. 14 to 16, the transistor 12, the lower electrode 16 of the MIM capacitor 40, the first CVD insulating film 48 and the high-dielectric-constant film 20 are formed, as are those in the first embodiment.

Figure 17:
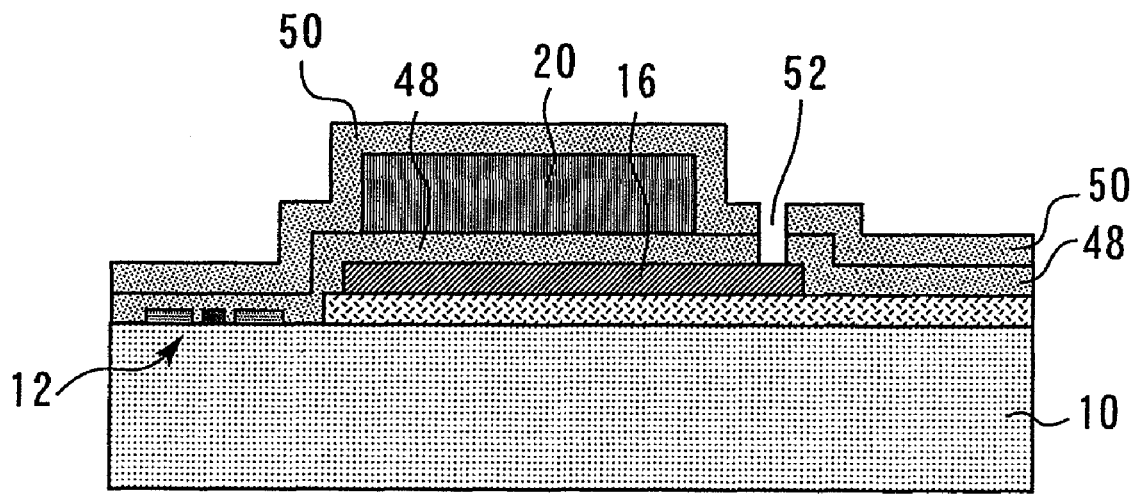

Subsequently, as shown in FIG. 17, the second CVD insulating film 50 is formed so as to cover the high-dielectric-constant film 20. A contact hole 52 extending through the first CVD insulating film 48 and the second CVD insulating film 50 is thereafter formed.

Figure 18:
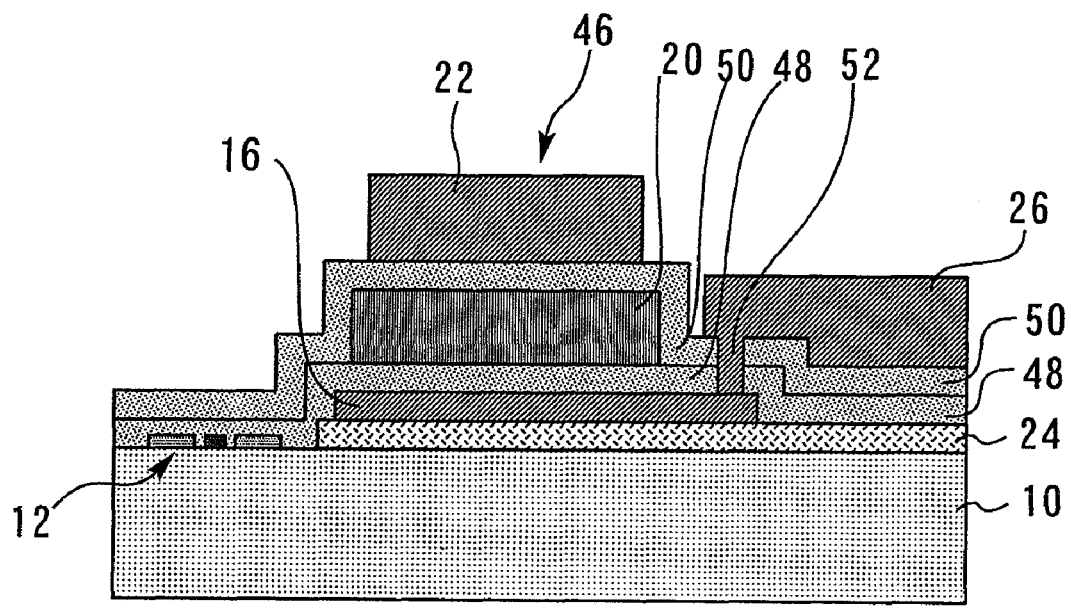

Subsequently, as shown in FIG. 18, the upper electrode 22 is formed on the second CVD insulating film 50. At this time, the piece of wiring 26 connected to the lower electrode and the piece of wiring connected to the upper electrode 22 (not shown) are formed simultaneously with the upper electrode 22.

Figure 19:
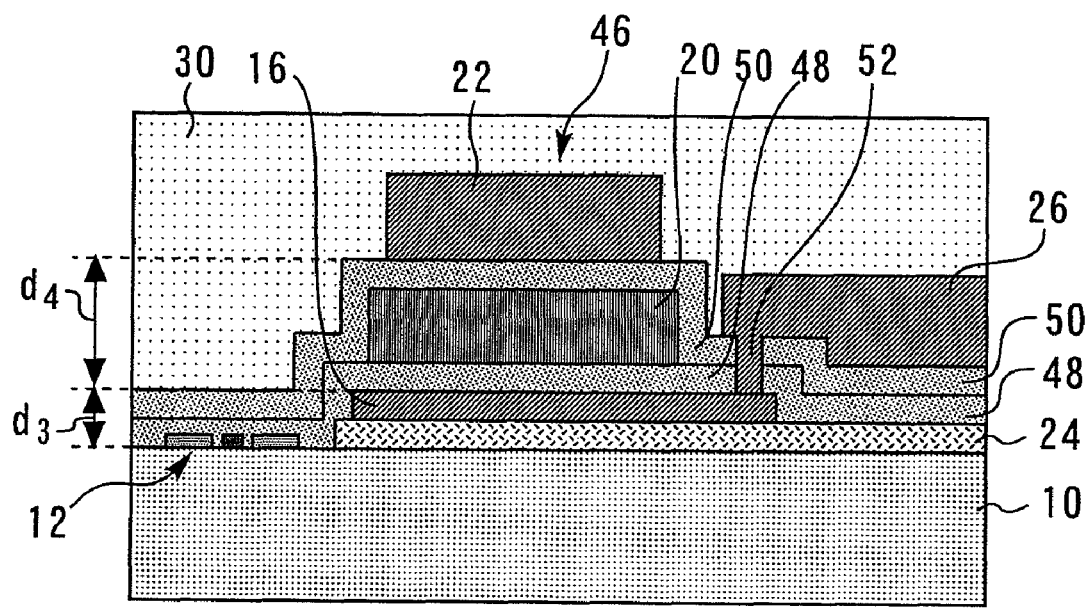

Subsequently, as shown in FIG. 19, a protective film 30 is formed so as to cover the transistor 12 and the MIM capacitor 46. The semiconductor device according to the second embodiment is manufactured by the above-described process. In other respects, the method of manufacturing the semiconductor device according to the second embodiment is the same as that in the first embodiment.

Advantages of the Second Embodiment

The advantages of the second embodiment will be described below.

The advantage obtained by applying CVD and forming the second CVD insulating film 50 will first be described by way of comparison with the above-described first comparative example.

As shown in FIGS. 9 and 10, the upper electrode 22 according to the above-described first comparative example is formed on the high-dielectric-constant film 38. Therefore, there is a possibility of the upper electrode 22 being separable more easily in this case than in the case of being formed on a CVD insulating film ordinarily used as a dielectric film for MIM capacitors.

In the second embodiment, the second CVD insulating film 50 is formed by CVD with high reactivity at a growth surface so as to over the high-dielectric-constant film 20. The upper electrode 22 is formed not on the high-dielectric-constant film 20 but on the second CVD insulating film 50. Thus, the upper electrode 22, unlike that in the first comparative example, is not directly formed on the high-dielectric-constant film 20. Consequently, easy separation of the upper electrode 22 can be prevented.

The advantage obtained by setting the total film thickness d3 of the first CVD insulating film 48 and the second CVD insulating film 50 to 30 nm will next be described. The same advantage as that obtained by setting the film thickness d1 of the CVD insulating film 18 shown in FIG. 1 in the first embodiment from 30 to 50 nm can be obtained by setting the film thickness d3 within the range from 30 to 50 nm. That is, the capacitance of the MIM capacitor 46 can be increased and the desired insulation withstand voltage of the first CVD insulating film 48 and the second CVD insulating film 50 can be obtained. In the second embodiment, since the film thickness d3 is set to 30 nm, the film thickness d3 falls within this range, and thus achieving the advantage.

The advantage obtained by setting the total film thickness d4 of the first CVD insulating film 48, the high-dielectric-constant film 20 and the second CVD insulating film 50 to 300 nm will next be described. Increasing both the withstand voltage and the capacitance of the MIM capacitor 46 can be achieved most advantageously by setting the ratio of the film thickness d3 and the film thickness d4 to 1:10 (by setting the film thickness d3 to 30 nm and setting the film thickness d4 to 300 nm), as in the case of the first embodiment. Also, the effect of achieving both increasing the withstand voltage and the capacitance can be achieved if the ratio of the film thickness d3 and the film thickness d4 is within the range from 1:9 to 1:11. In the second embodiment, since each of the film thicknesses d3 and d4 is set to 30 nm and 300 nm, the ratio falls within this range, thus achieving the advantage.

The major benefits of the present invention described above are summarized follows:

According to one aspect of the present invention, a semiconductor device can be easily manufactured in which a high-dielectric-constant film of a MIM capacitor constituted of a high-k material having a dielectric constant of 10 or more is not formed in any of places where transistors or pieces of wiring are provided. According to the other aspects of the present invention, separation of the high-dielectric-constant film and the upper electrode of the MIM capacitor can be prevented.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-301313, filed on Nov. 26, 2008 including specification, claims, drawings and summary, on which the Convention priority of the present application is based, are incorporated herein by reference in its entirety.

What is claimed is:

1. A method of manufacturing a semiconductor device, comprising:
   forming a transistor on a semiconductor substrate;
   forming a lower electrode supported by the semiconductor substrate and spaced from the transistor;
   forming a first CVD insulating film covering the transistor and the lower electrode;
   applying a photoresist on the first CVD insulating film;
   forming an opening in the photoresist opposite the lower electrode and spaced from and within a periphery of the lower electrode;
   forming a high-dielectric constant film constituted of a high-k material having a dielectric constant of at least 10 in the opening and on the photoresist;
   removing the photoresist and the high-dielectric-constant film on the photoresist so that the high-dielectric-constant film remains opposite the lower electrode and spaced from and within the periphery of the lower electrode; and
   forming an upper electrode on the high-dielectric-constant film that remains.

2. The method of manufacturing a semiconductor device according to claim 1, comprising forming the first CVD insulating film to a thickness in a range from 30 nm to 50 nm.

3. The method according to claim 2, wherein the first CVD insulating film is selected from the group consisting of SiN, SiO and SiON.

4. A The method of manufacturing a semiconductor device according to claim 1, wherein
   each of the high-dielectric constant film and the first CVD insulating film has a thickness; and
   the ratio of thickness of the first CVD insulating film to the sum of the thicknesses of the high-dielectric-constant film and the first CVD insulating film is in a range from 1: 9 to 1: 11.

5. The method according to claim 4, wherein the CVD insulating film is SiN.

6. The method according to claim 1, wherein the high-dielectric-constant film is selected from the group consisting of $Ta_2O_5$, $ZrO_2$, and $HfO_2$.

7. The method according to claim 2, wherein the high-dielectric-constant film is selected from the group consisting of $Ta_2O_5$, $ZrO_2$, and $HfO_2$.

8. The method according to claim 3, wherein the high-dielectric-constant film is selected from the group consisting of $Ta_2O_5$, $ZrO_2$, and $HfO_2$.

9. The method according to claim 4, wherein the high-dielectric-constant film is selected from the group consisting of $Ta_2O_5$, $ZrO_2$, and $HfO_2$.

10. The method according to claim 5, wherein the high-dielectric-constant film is selected from the group consisting of $Ta_2O_5$, $ZrO_2$, and $HfO_2$.

11. The method according to claim 1 further comprising, after forming the high-dielectric constant film and before forming the upper electrode, forming a second CVD insulating film on the high-dielectric constant film.

* * * * *